(12) United States Patent
Teruo (10) Patent No.: US 6,845,332 B2
(45) Date of Patent: Jan. 18, 2005

(54) STATE OF CHARGE CALCULATION DEVICE AND STATE OF CHARGE CALCULATION METHOD

(75) Inventor: Ishishita Teruo, Nishikamo-gun (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 176 days.

(21) Appl. No.: 10/284,319

(22) Filed: Oct. 31, 2002

(65) Prior Publication Data

US 2003/0097225 A1 May 22, 2003

(30) Foreign Application Priority Data

Nov. 16, 2001 (JP) ........................................ 2001-352033
Feb. 21, 2002 (JP) ........................................ 2002-045028

(51) Int. Cl.$^7$ ............................................. G01R 31/36
(52) U.S. Cl. ........................................ 702/63; 320/132
(58) Field of Search ............................. 702/57, 63–65, 702/85, 89, 99, 132, 149; 320/132, 149; 324/427, 428; 340/636.1, 636.12, 636.13, 636.15

(56) References Cited

U.S. PATENT DOCUMENTS 5,281,919 A * 1/1994 Palanisamy ................. 324/427
6,127,806 A * 10/2000 Tanjo et al. ................. 320/132
6,150,823 A * 11/2000 Takahashi et al. .......... 324/427
6,359,419 B1 * 3/2002 Verbrugge et al. .......... 320/132

FOREIGN PATENT DOCUMENTS

| JP | 56-126773 | 10/1981 | |
|----|-----------|---------|----|
| JP | 6-150981 | 5/1994 | |
| JP | 11-174134 | 7/1999 | |
| JP | 11-178225 | 7/1999 | |
| JP | 11-178225 A | 7/1999 | |
| JP | 2000166109 A * | 6/2000 | ............. H02J/7/00 |

* cited by examiner

Primary Examiner—Donald E. McElheny, Jr.
Assistant Examiner—Manuel L. Barbee
(74) Attorney, Agent, or Firm—Kenyon & Kenyon (57) ABSTRACT

A state of charge calculation device includes an ammeter for detecting charge and discharge currents of a secondary battery, a state detection sensor for detecting a start time of discharge from the secondary battery to an engine, a battery electronic control unit (ECU) for calculating a state of charge of the secondary battery. The battery ECU of this state of charge calculation device calculates the state of charge of the secondary battery, based on the current and voltage detected at the time when discharge starts.

4 Claims, 6 Drawing Sheets

STATE OF CHARGE CALCULATION DEVICE AND STATE OF CHARGE CALCULATION METHOD

INCORPORATION BY REFERENCE

The disclosures of Japanese Patent Applications No. 2001-352033 filed on Nov. 16, 2001, and No. 2002-45028 filed on Feb. 21, 2002, each including the specification, drawings and abstract is incorporated herein by reference in its entirety.

BACKGROUND OF THE INVENTION

1. Field of the Invention

This invention relates to a state of charge calculation device and a state of charge calculation method

2. Description of the Related Art

A secondary battery is used as a main or auxiliary power source in various fields such as automobiles, hybrid vehicles and electric carts. In order to operate this secondary battery efficiently, it is necessary to accurately execute charge and discharge control. Accordingly, a method for accurately calculating the state of charge (hereinafter referred to as "SOC") of the secondary battery is required.

A method which uses current integration of charge and discharge currents has been known as a method for calculating the SOC of a secondary battery. However, with this current integration method, it is sometimes problematic to calculate the SOC of the secondary battery with a high degree of accuracy, when a battery is used that has not been fully charged or fully discharged. This is because, accuracy is strongly influenced, for example, by errors resulting from the omission of LSB digits of the CPU for calculating the SOC, or a fall in charge due to self-discharge. Furthermore, accuracy is also highly dependent on the accuracy of the current sensor.

As a result, a method in which an SOC estimate is corrected using an estimated voltage of a battery is proposed in PCT Laid-Open Publication No. WO99/61929.

However, with this SOC estimate correction method using estimated voltage, the accuracy of the SOC estimate using voltage can fall, depending on the SOC level. As a result, the accuracy of the calculation of the SOC of the battery is dependent on the charge and discharge pattern of the battery. Accordingly, the accuracy of the calculation the SOC of the battery sometimes deteriorates depending on the charge and discharge pattern. In addition, charge and discharge levels which cause the accuracy of the SOC estimate to deteriorate, are mainly within the normal usage range of the battery.

Moreover, in Japanese Patent Laid-Open No. 11-174134, a device is proposed for correcting the SOC estimate when the SOC value is within a predetermined range.

The device disclosed in this publication includes an SOC detection circuit for detecting the SOC of the secondary battery, a region specification circuit for specifying the current-voltage regions, a confirmation circuit that confirms whether sufficient charging and discharging to depart from a specified region has been executed, and a prohibition circuit which prohibits detection operations by the SOC detection circuit until confirmation by the confirmation circuit is completed. In addition, if the calculated SOC is below a lower limit value (for example, 20 percent) or above an upper limit value (for example, 80%), SOC correction is executed. Furthermore, SOC correction is not resumed until the corrected SOC has departed from a predetermined region. As a result, errors in the SOC estimate are prevented.

Accordingly, when the secondary battery is being used normally, namely, when the secondary battery is being repeatedly charged and discharged, a significant difference between the calculated SOC (hereinafter referred to as the "calculated value") and the actual SOC (hereinafter referred to as the "actual value") does not occur.

However, if the secondary battery naturally discharges, the SOC reduces. As a result, the actual value becomes significantly different from the calculated value. For example, the SOC of a secondary battery of an automobile that has not been used for a long time reduces due to natural discharge. However, the calculated value indicates the last calculated SOC. At such a time, the calculated value is higher than the actual value. Moreover, if the secondary battery is replaced, a secondary battery is used which is different from the secondary battery for which SOC was last calculated. As a result, the calculated value and the actual value are substantially different.

Figure 8:
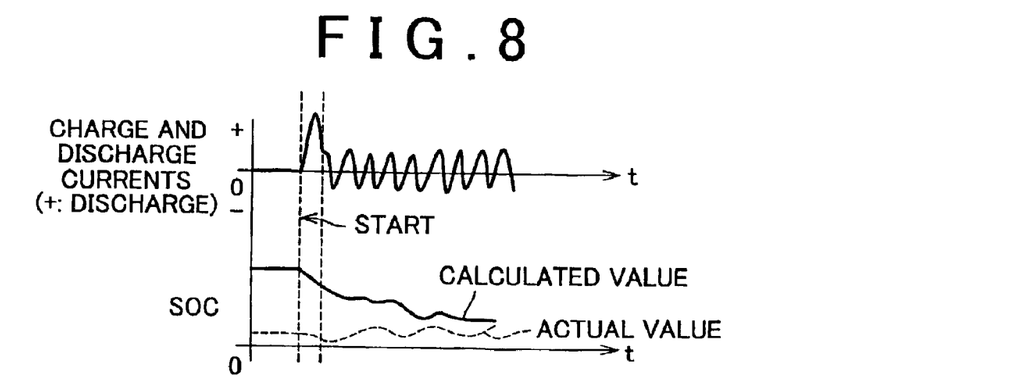
FIG. 8 is a graph showing changes in SOC when a conventional SOC calculation device is executing processing.

In the case that the secondary battery naturally discharges, the calculation device disclosed in the aforementioned publication executes calculation of the SOC. The SOC value of the secondary battery which is displayed on a monitor or the like, reduces until the difference between the calculated value and the actual value is eliminated. However, the SOC display continues to show the reduction in the SOC even when the secondary battery is charged. FIG. 8 shows changes in the calculated value and the actual value when the device disclosed in the aforementioned publication executes calculation of the SOC.

SUMMARY OF THE INVENTION

It is an object of the invention to provide an SOC calculation device and an SOC calculation method for a battery which can ensure that SOC is estimated with a high degree of accuracy, without depending on the battery charge and discharge level.

Moreover, it is a further objective of the invention to provide an SOC calculating device and an SOC calculating method capable of accurately calculating the SOC of a secondary battery by correcting the SOC estimate, based on a period in which the battery discharges to a load.

An SOC calculation device according to a first aspect of the invention, detects the SOC of the secondary battery connected to a load. This SOC calculation device includes a current detection portion for detecting the charge and discharge currents of the secondary battery, a voltage detection portion for detecting the voltage of the secondary battery, and a discharge start time detection portion for detecting the time at which the secondary battery starts to be discharged to the load. The device also includes a controller for calculating the SOC of the secondary battery based on the aforementioned detected current and the aforementioned detected voltage, using a method that corresponds with the time at which discharge starts.

The method according to the first aspect of the invention may be, for example, a method that is selected from among the two or more stored methods for calculating the SOC, or the method corresponding to the calculating method using a parameter that is selected from among the two or more stored parameters for calculating the SOC that corresponds with a time at which discharge starts.

Moreover, an SOC calculation device according to a second aspect of the invention includes the current detection portion for detecting a discharge current of a battery, and the voltage detection portion for detecting a voltage of the battery. The device also includes a controller which calculates a first SOC estimate by integrating the aforementioned detected discharge current. The controller then corrects this first SOC estimate using an electromotive voltage correction parameter that is determined using electromotive voltage based on the aforementioned detected voltage.

BRIEF DESCRIPTION OF THE DRAWINGS

The foregoing and further objects, features and advantages of the invention will become apparent from the following description of preferred embodiments with reference to the accompanying drawings, wherein like numerals are used to represent like elements and wherein.

DESCRIPTION OF THE PREFERRED EMBODIMENT

Hereinafter, a preferred first embodiment according to the invention will be described referring to FIG. 1 to FIG. 6, in order to clarify the invention in further detail.

Figure 1:
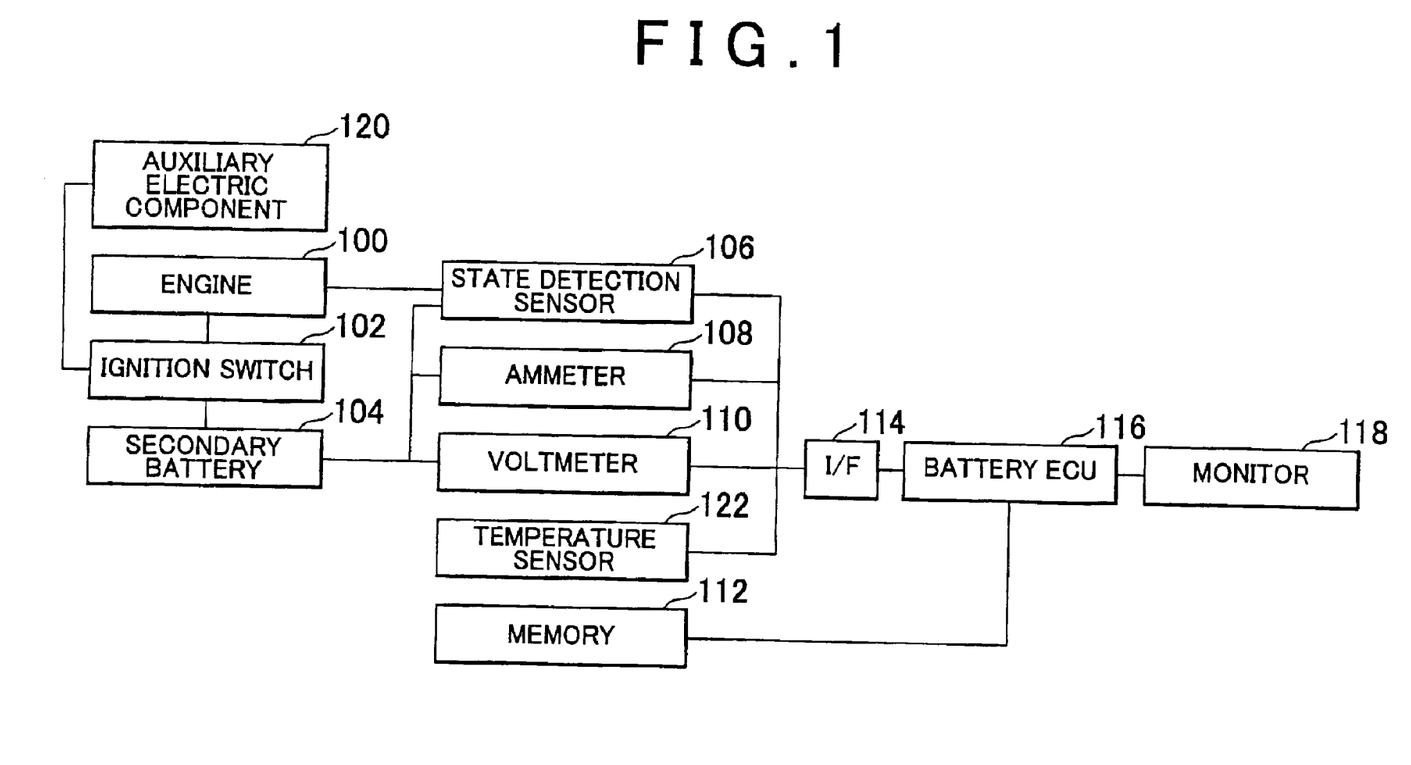
FIG. 1 is a view showing a structure of an SOC calculation device of a secondary battery according to a first embodiment of the invention.

FIG. 1 shows a block diagram of the control of a vehicle including an SOC calculation device according to the first embodiment of the invention. The vehicle includes an engine 100, an auxiliary electric component 120, an ignition switch (hereinafter referred to as "I/G switch") 102, a secondary battery 104, a state detection sensor 106, an ammeter 108, a voltmeter 110, a memory 112, an interface (hereinafter referred to as "I/F") 114, a battery electronic control unit (hereinafter referred to as "battery ECU") 116, a monitor 118, and a temperature sensor 122.

The engine 100 and the auxiliary electric component 120 are connected to the secondary battery 104 via the I/G 102. The auxiliary electric component 120 is, for example, a car audio device or an air conditioner. The secondary battery 104 is connected to the state detection sensor 106, the ammeter 108 and the voltmeter 110.

The state detection sensor 106 is connected to the engine 100 and the secondary battery 104. The state detection sensor 106, the ammeter 108, the voltmeter 110 and the temperature sensor 122 are connected to the battery ECU 116 via the I/F 114. The memory 112 and the monitor 118 are connected to the battery ECU 116.

The state detection sensor 106 detects the time when the engine 100 starts to operate by detecting a movement of the I/G 102. Furthermore, the state detection sensor 106 may detect this time by, for example, detecting a change in acceleration when the crankshaft starts to rotate, or a change in current or voltage when the secondary battery 104 is discharging, or the like.

The ammeter 108 detects the discharge current from the secondary battery 104 and the charge current to the secondary battery 104. The voltmeter 110 detects a terminal voltage of the secondary battery 104. The terminal voltage denotes the voltage of the output terminal of the secondary battery 104. The temperature sensor 122 detects a temperature of the secondary battery 104.

The memory 112 stores a numerical formula (hereinafter referred to as "formula 1") used in calculation of the electromotive voltage V1. This formula 1 is, for example, V1=(terminal voltage−charge/discharge polarization voltage−internal resistor drop voltage). V1 is the electromotive voltage prior to execution of attenuation processing, which will be described later. The terminal voltage is detected by the voltmeter 110. The battery ECU 116 calculates the charge/discharge polarization voltage and the internal resistor drop voltage based on the current detected by the ammeter 108.

The memory 112 stores a predetermined electromotive voltage/SOC map that shows the relationship between the electromotive voltage of the secondary battery 104 and an SOC estimate. The SOC estimate is specified based on the electromotive voltage/SOC map and the electromotive voltage. The memory 112 stores a gain map used to calculate the SOC of the secondary battery 104.

Figure 2:
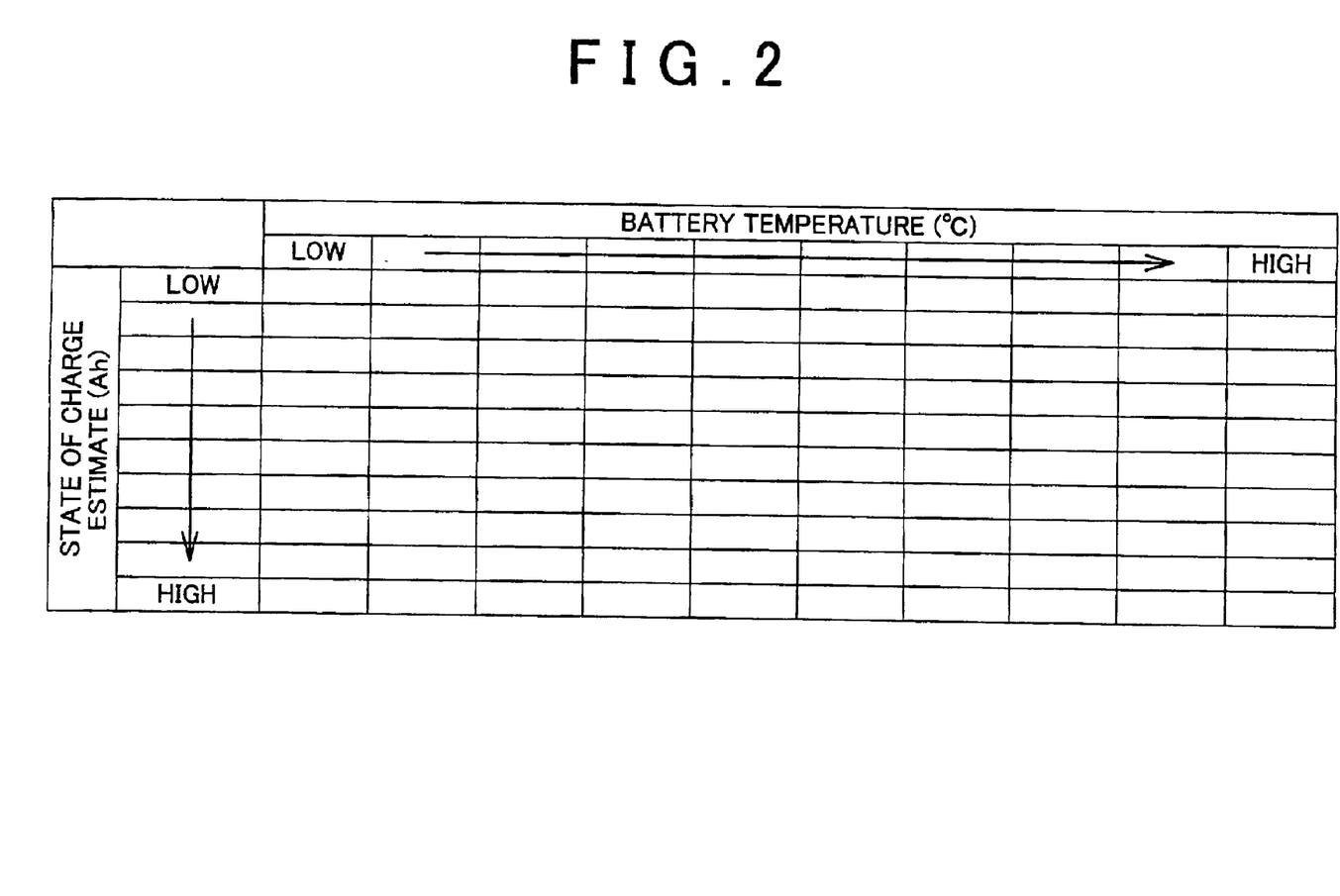
FIG. 2 is a gain map 1 used by the SOC calculation device of the secondary battery according to the first embodiment of the invention.
Figure 3:
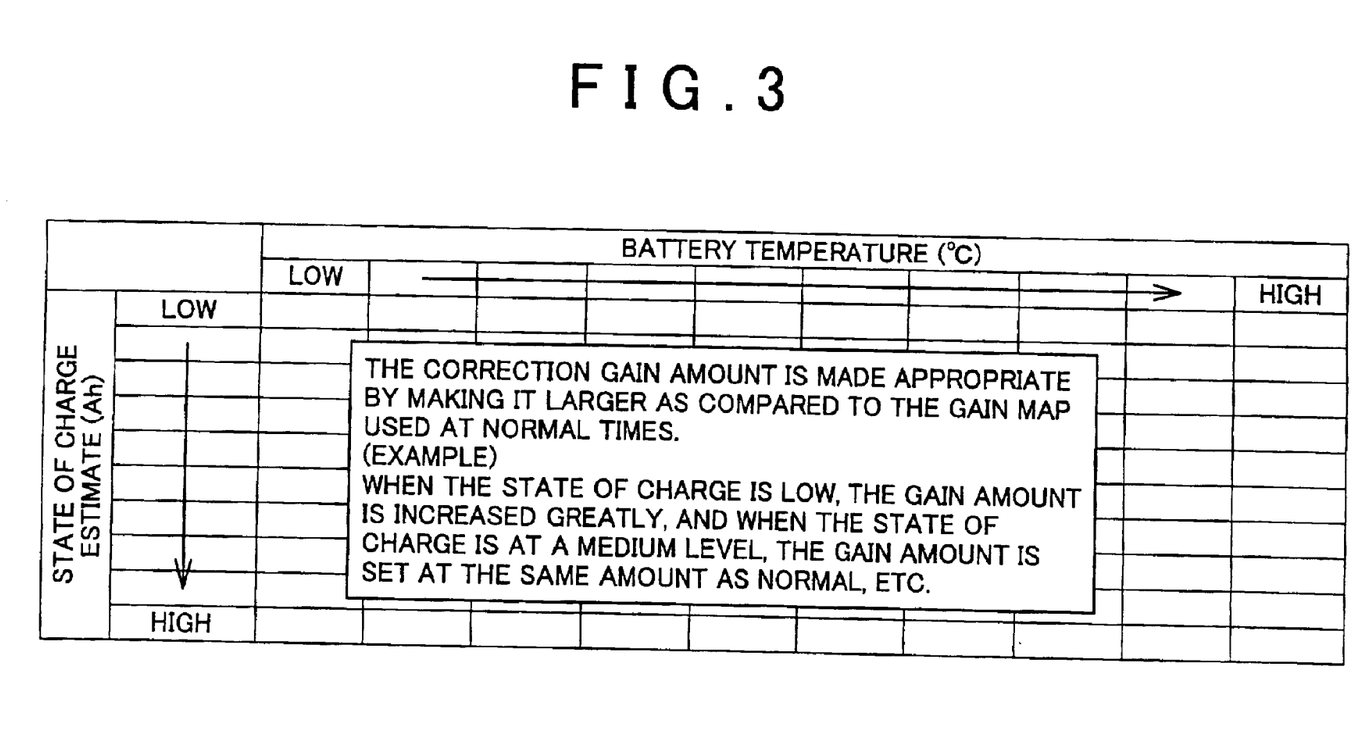
FIG. 3 is a gain map 2 used by the SOC calculation device of the secondary battery according to the first embodiment of the invention.

FIG. 2 and FIG. 3 show the gain maps stored in the memory 112. FIG. 2 shows the correction gain map M 2 used to execute calculation at times other than when the engine 100 starts cranking. FIG. 3 is a correction gain map M 1 used to execute processing when the engine 100 starts cranking. The battery ECU 116 specifies a correction gain used in the calculation of a correction amount, based on the temperature of the secondary battery 104 detected by the temperature sensor 122.

The difference between FIG. 2 and FIG. 3 is the size of the correction gain. The correction gain of FIG. 3 is used when the engine 100 starts cranking and is larger than the correction gain of FIG. 2. As a result of this, the correction amount calculated using the correction gain map M 1 is larger than the correction amount calculated using the correction gain map M 2. With this relationship, it is possible to make the correction amount larger when the engine 100 starts cranking.

The memory 112 stores predetermined time constants $\tau 1$ and $\tau 2$. $\tau 1$ and $\tau 2$ are time constants used during the execution of attenuation processing. These time constants are used for the numerical formulas used for attenuation processing of electromotive voltage, as will be described hereinafter. $\tau 1$ is used in the calculation of SOC that is executed when the engine 100 starts cranking. $\tau 2$ is used in the calculation of SOC at times other than when the engine 100 starts cranking. $\tau 1$ is smaller than $\tau 2$. With this relationship, the time taken until electromotive voltage calculated using $\tau 1$ converges on a target value is less than the time taken for electromotive voltage calculated using $\tau 2$ to converge on a target value.

The memory 112 stores a numerical formula (hereinafter referred to as "formula 2") used in attenuation processing of the electromotive voltage. This formula 2 is, for example, $V2=V0+\{T/\tau\times(V1-V0)\}$. V0 is the electromotive voltage calculated by the previous attenuation processing. V1 is the electromotive voltage calculated before the present attenuation processing. V2 is the electromotive voltage calculated after the present attenuation processing. T is a constant stored in the memory 112 in advance and indicates the interval between attenuation processing. $\tau$ is selected from either one of the aforementioned $\tau$ 1 and $\tau$ 2, based on certain predetermined conditions.

The memory 112 stores a numerical formula (hereinafter referred to as "formula 3" for calculating a correction value C. This formula 3 is, for example, $C=G\times\Delta$ SOC. G indicates the correction gain. Correction gain G is specified from one or other of gain map M 1 or gain map M 2 based on the battery temperature. $\Delta$ SOC indicates the difference between, an SOC estimate (hereinafter referred to as SOC 1) calculated by a first method that uses a current integrated value, and an SOC estimate (hereinafter referred to as SOC 2) estimated using a specified method 2 (hereinafter referred to as SOC 2) based on the electromotive voltage/SOC map.

The memory 112 stores the electromotive voltage V0 obtained by the last executed SOC calculation, the SOC of the secondary battery 104, and the battery ECU 116 processing information (for example, the time at which SOC calculation was executed, and so forth) when the engine 100 was last stopped.

The I/F 114 converts analogue signals from the state detection sensor 106, the ammeter 108, the voltmeter 110 and the temperature sensor 122 into digital signals, and then transmits the digital signals to the battery ECU 116.

The battery ECU 116 calculates the current integrated value using the discharge current from the secondary battery 104 and the charge current to the secondary battery 104 detected by the state detection sensor 106. The battery ECU 116 uses the calculated current integrated value to calculate the SOC 1. The battery ECU 116 then calculates the charge/discharge polarization voltage and the internal resistor drop voltage using the terminal voltage detected by the voltmeter 110 and the current detected by the ammeter 108. Furthermore, the battery ECU 116 calculates the electromotive voltage V1 using the terminal voltage, the charge/discharge polarization voltage, the internal resistor drop voltage and the formula 1.

The battery ECU 116 judges whether the engine is starting to crank based on the state of the engine 100 detected by the state detection sensor 106. In the case that the engine 100 is starting to crank, the battery ECU 116 selects the time constant $\tau$ 1 and the gain map M 1. In the case that the engine 100 is not starting to crank, the battery ECU 116 selects the time constant $\tau$ 2 and the gain map M 2.

The battery ECU 116 calculates the electromotive voltage V2 using the selected time constant and gain map, and the constant T indicating the interval between processing and formula 2 stored in the memory 112. The battery ECU 116 specifies SOC 2 from the electromotive voltage/SOC map based on the calculated electromotive voltage V2. The battery ECU 116 uses SOC 1 and SOC 2 to calculate $\Delta$ SOC.

The battery ECU 116 calculates the SOC correction amount C using the correction gain G specified from the selected gain map, the calculated $\Delta$ SOC and formula 3. The battery ECU 116 adds the calculated correction amount to the SOC 1 and calculates the SOC of the secondary battery 104. The battery ECU 116 outputs a signal indicating the calculated SOC.

The monitor 118 displays the SOC of the secondary battery 104 calculated by the battery ECU 116.

Figure 4:
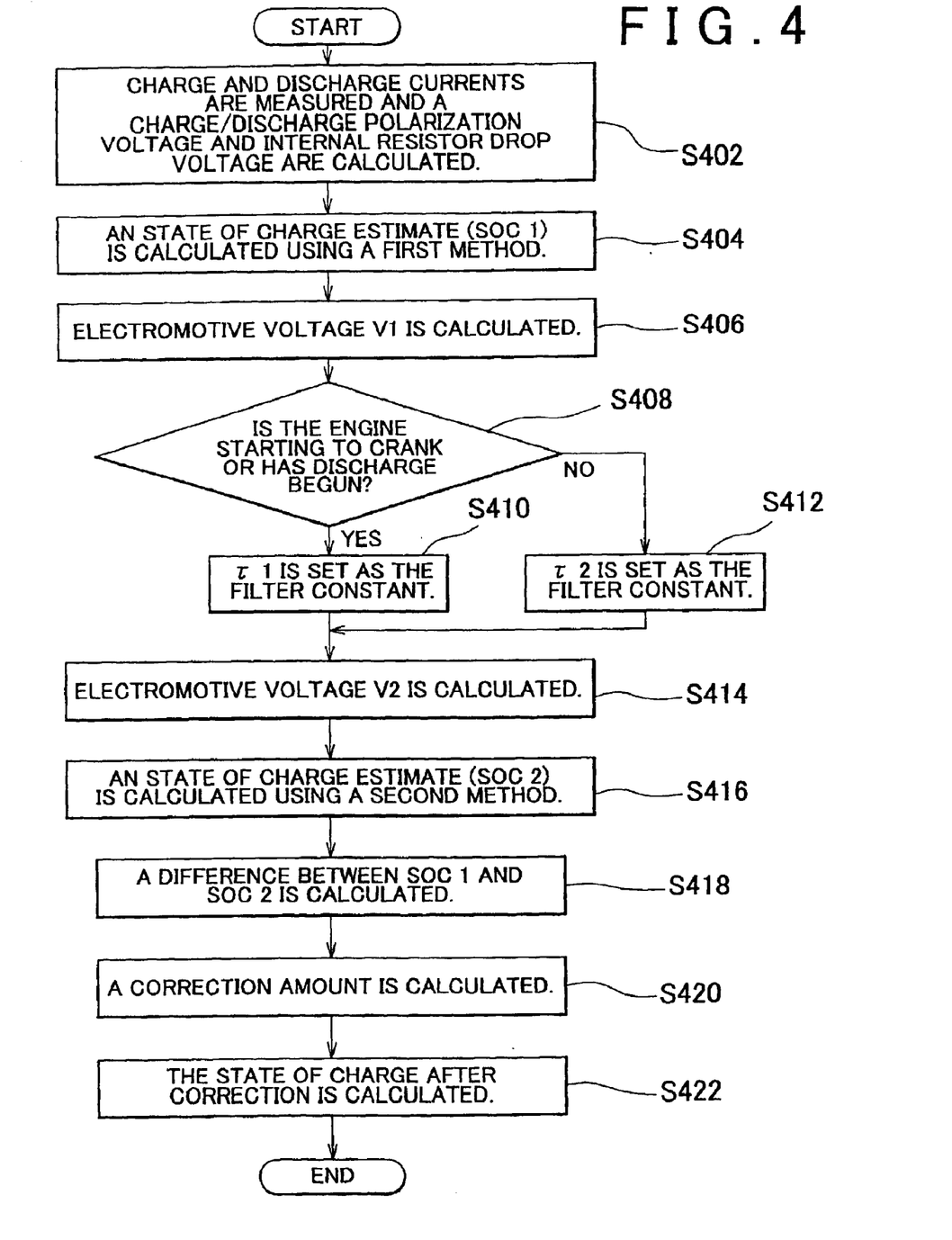
FIG. 4 is a flow chart showing the processing executed by the SOC calculation device of the secondary battery according to the first embodiment of the invention.

The procedure by which the SOC calculation device according to an embodiment of the invention calculates the SOC of the secondary battery 104 will be described hereinafter while referring to the flow chart of FIG. 4.

In step S402, the battery ECU 116 uses the ammeter 108 to detect the discharge current from the secondary battery 104 and the charge current to the secondary battery 104. The battery ECU 116 calculates the current integrated value based on the detected current. The battery ECU 116 calculates the charge/discharge polarization voltage and internal resistor drop voltage of the secondary battery 104. The battery ECU 116 uses the state detection sensor 106 to detect whether the engine 100 is starting to crank. This detection is executed using, for example, the change in acceleration when the crack shaft begins to rotate, or the change in current discharged from the secondary battery 104.

In step S404, the battery ECU 116 calculates the SOC 1 based on the calculated current integrated value.

In step S406, the battery ECU 116 detects the terminal voltage of the secondary battery 104 using the voltmeter 110. The battery ECU 116 calculates the electromotive voltage V1 using the terminal voltage, the charge/discharge polarization voltage, the internal resistor drop voltage and formula 1.

In step S408, the battery ECU 116 judges whether the engine 100 is starting to crank based on the time when the engine 100 starts to operate detected by the state detection sensor 106. In the case that the engine 100 is starting to crank (indicated by YES in step S408), the process proceeds to step S410. In the case that the engine 100 is not starting to crank (indicated by NO in step S408), the process proceeds to step S412.

In step S410, the battery ECU 116 selects $\tau$ 1 from among the time constants $\tau$ 1 and $\tau$ 2 stored in the memory 112. The battery ECU 116 selects the gain map 1 from among the gain maps stored in the memory 112. Following this, the process proceeds to step S414.

In step S412, the battery ECU 116 selects $\tau$ 2 from among the time constants $\tau$ 1 and $\tau$ 2 stored in the memory 112. The battery ECU 116 selects the gain map 2 from among the gain maps stored in the memory 112. Following this, the process proceeds to step S414.

In step S414, the ECU calculates the electromotive voltage V2 using one of the time constants $\tau$ 1 and $\tau$ 2, the constant T indicating the interval between processing, the electromotive voltage V1, the electromotive voltage V0 calculated last time and formula 2.

In step S416, the battery ECU 116 calculates SOC 2 based on the calculated electromotive voltage V2.

In step S418, the battery ECU 116 calculates the difference ($\Delta$ SOC) between SOC 1 and SOC 2.

In step S420 the battery ECU 116 calculates the correction amount C using the correction gain G, the calculated $\Delta$ SOC and formula 3.

In step S422, the battery ECU 116 adds the correction amount C to the SOC 1. The calculated value is the SOC of the secondary battery 104. The battery ECU 116 transmits a signal indicating the SOC to the monitor 118. The battery ECU 116 completes calculation processing of the SOC of the secondary battery 104.

Hereinafter, the operations, in various cases, of the SOC calculation device according to this embodiment will be described, based on the aforementioned configuration and flow chart.

[When Cranking Starts]

If the user starts the engine 100, the ammeter 108 detects the current discharged from the secondary battery 104. The current integrated value and the charge/discharge polarization voltage and internal resistor drop voltage of the secondary battery 104 are calculated based on the detected current. The state detection sensor 106 detects the state of the engine 100 (step S402). SOC 1 is calculated based on the calculated current integrated value (step S404).

The voltmeter 110 measures the terminal voltage of the secondary battery 104. The electromotive voltage V1 is calculated using the terminal voltage, the charge/discharge polarization voltage, the internal resistor drop voltage, and formula 1.

If the battery ECU 116 judges that the engine 100 is starting to crank (indicated by YES in step S408), the gain map M 1 and time constant $\tau$ 1 are selected (step S410).

The electromotive voltage V2 is calculated using the electromotive voltage V0 calculated last time and the constant T indicating the interval between processing stored in the memory 112, the selected time constant $\tau$ 1 and formula 2 (step S414).

SOC 2 is specified based on the calculated electromotive voltage V2 and the gain map (FIG. 3) stored in the memory 112 (step S416). $\Delta$ SOC which is the difference between SOC 1 and SOC 2 is calculated (step S418). The correction amount C is calculated using the calculated $\Delta$ SOC, the correction gain G specified from the selected gain map M (1), and the formula (3) (S420).

The SOC of the secondary battery 104 is calculated using the SOC 1 and the calculated correction amount (step S422). Once the SOC of the secondary battery 104 is calculated, the battery ECU 116 transmits a signal notifying this SOC to the monitor 118 disposed near to the driver's position.

Figure 5:
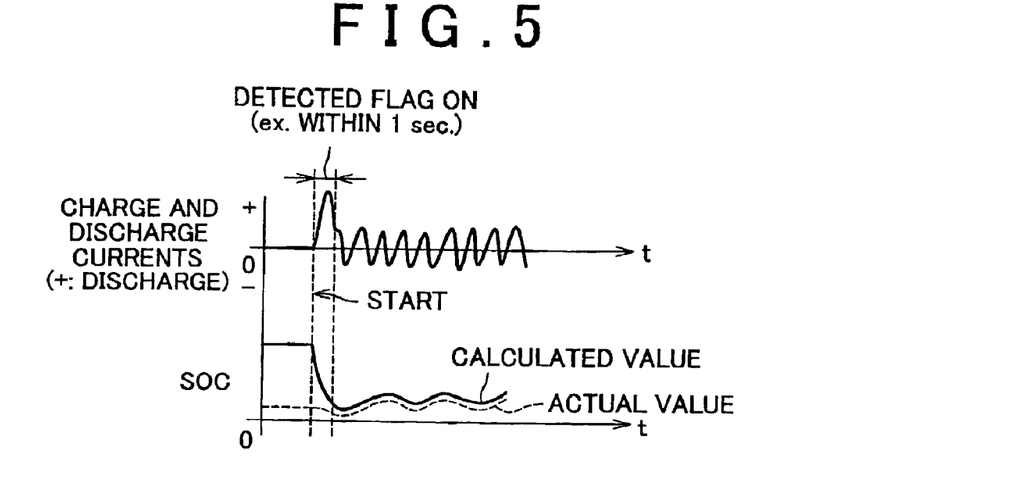
FIG. 5 is a graph showing changes in calculated SOC while the SOC calculation device of the secondary battery according to the first embodiment of the invention is executing processing when an engine starts cranking.

FIG. 5 shows changes in SOC calculated when the engine 100 starts to crank. The battery EUC 116 selects the gain map M 1 and the time constant $\tau$ 1 for the calculation processing. The battery ECU 116 calculates a correction amount that is greater than the correction amount calculated normally, or in other words, at times other than when the engine 100 is starting to crank. The time required for the calculated SOC to converge on the actual SOC is less than the time required for the SOC calculated at normal times to converge on the actual value. As a result, the SOC calculated by the battery ECU 116 converges on the actual SOC of the secondary battery 104 faster than at normal times.

[At Times Other Than When Cranking Starts]

Once calculation processing starts based on the predetermined SOC calculation processing interval, the ammeter 108 detects the discharge current from the secondary battery 104. The current integrated value and the charge/discharge polarization voltage and internal resistor drop voltage of the secondary battery 104 are calculated based on the detected current. The state detection sensor 106 detects the state of the engine 100 (step S402). SOC 1 is calculated based on the calculated current integrated value (step S404).

The voltmeter 110 measures the terminal voltage of the secondary battery 104. The electromotive voltage V1 is calculated based on the terminal voltage, the charge/discharge polarization voltage, the internal resistor drop voltage and formula 1 (step S406).

When the battery ECU 116 judges that the engine 100 is not starting to crank (indicated by NO in step S408), the gain map M 2 and the time constant $\tau$ 2 are selected (step S412).

The electromotive voltage V2 is calculated using the electromotive voltage V0 calculated last time and the constant T indicating the interval between processing stored in the memory 112, the selected time constant $\tau$ 1 and formula 2 (step S414).

SOC 2 is specified based on the calculated electromotive voltage V2 and the gain map (FIG. 2) stored in the memory 112 (step S416). $\Delta$ SOC which is the difference between SOC 1 and SOC 2 is calculated (step S418). The correction amount C is calculated using the calculated $\Delta$ SOC, the correction gain G specified from the selected gain map M 2, and the formula 3 (S420).

The SOC of the secondary battery 104 is calculated using SOC 1 and the calculated correction amount (step S422). Once the SOC of the secondary battery 104 is calculated, the battery ECU 116 transmits a signal notifying this SOC to the monitor 118 disposed near to the driver's position.

Figure 6:
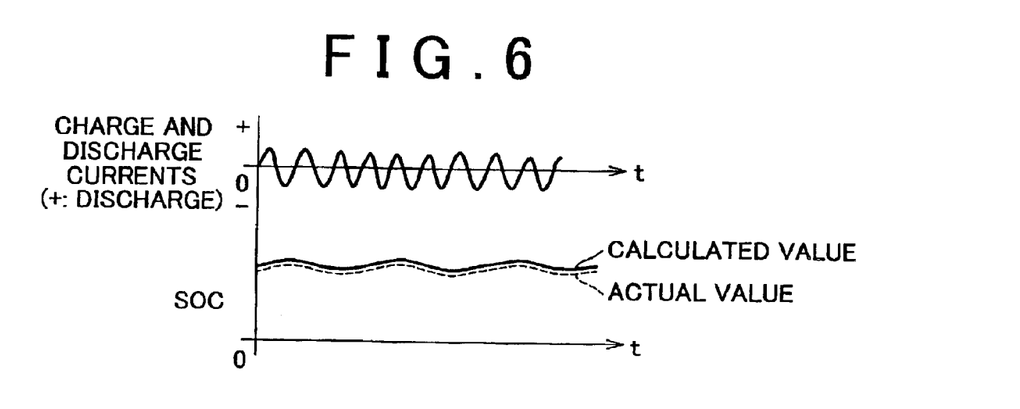
FIG. 6 is a graph showing changes in calculated SOC at times other than when an engine starts cranking while the SOC calculation device of the secondary battery according to the first embodiment of the invention is executing processing.

FIG. 6 shows changes in SOC calculated at times other than when the engine 100 starts to crank. In this case, there is little difference between the actual value of the SOC and the value calculated by the battery ECU 116. The gain map M (2) and time constant $\tau$ 2 are selected during the calculation processing. Based on this, the battery ECU 116 selects a predetermined correction amount and the calculated SOC converges on the actual value within a predetermined time. As a result, changes in the SOC calculated by the battery ECU 116 follows changes in the actual SOC of the secondary battery 104.

Figure 7:
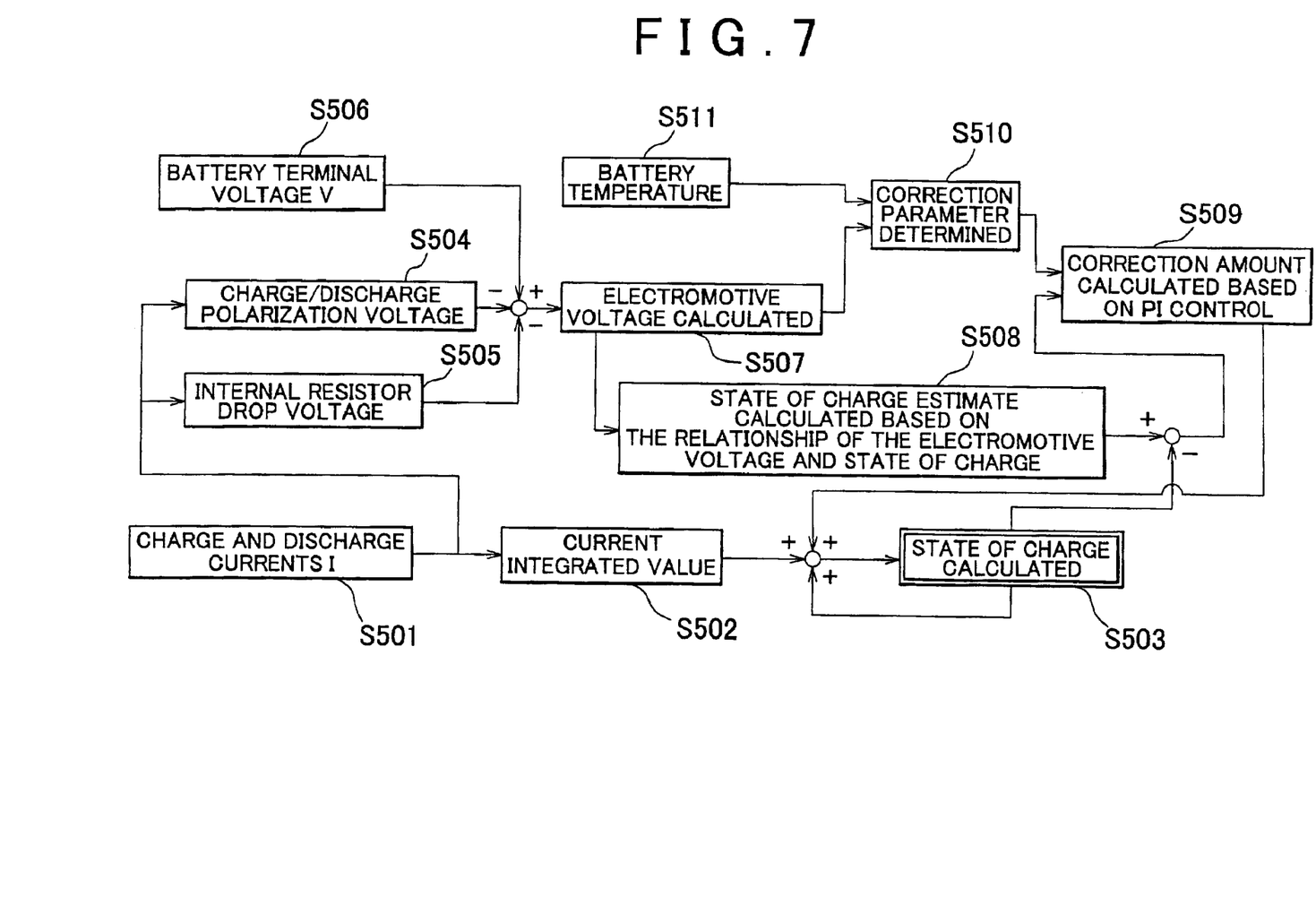
FIG. 7 is an explanatory view of an SOC calculation method of a secondary battery according to a second embodiment of the invention.

FIG. 7 shows changes in SOC corrected by a conventional SOC calculation device. In this case, the calculation device does not change the parameters (for example, gain maps, time constants, etc.) used in calculation programming based on a determination as to whether the engine 100 is starting to crank. The calculation device executes SOC correction processing based on the gain map and time constant stored in advance.

For example, in the case that SOC has reduced due to natural discharge, if SOC calculation processing of the secondary battery 104 is executed, it takes time until the calculated SOC value converges on the actual SOC value. During this period, the monitor 118 continues to display the reduction in SOC even though the secondary battery 104 is charged.

Thus, the parameters used in SOC calculation processing are selected based on a determination as to whether it is a time when the engine 100 is starting to operate (for example, when the engine 100 is starting to crank). The user can confirm the calculated SOC of the secondary battery 104 when the engine 100 started to crank, by referring to the monitor 118 disposed near to the driver's seat.

Accordingly, in the case of SOC that has been reduced by natural discharge, and so forth, the SOC value is updated to a new value corresponding to this reduction due to calculation processing executed at the time the engine 100 began to crank. As a result, the monitor 118 displays SOC information which is highly accurate Thus, the SOC of the secondary battery can be corrected based on the current, voltage and time at which the engine 100 starts to operate, in accordance with when the user starts the engine. As a result, the SOC is corrected based on the time when the secondary battery discharges to a load, and an SOC calculation device can be provide which is capable of calculating the SOC of the secondary battery with a high degree of accuracy.

Furthermore, the characteristic value used in SOC calculation processing may be selected based on the time when the battery ECU 116 detects that the position of the ignition key of a vehicle is such that an auxiliary electronic component is in a usable state (for example, the ACC (accessory) state of the ignition key), due to discharge from the secondary battery.

Moreover, when the engine is cranking, a calculation method (formula, etc.) may be selected which reduces the time required for SOC calculation processing.

Hereinafter, a preferred second embodiment of the invention will be described while referring to FIG. 1 to FIG. 7. Within this description, members which are the same as those in the first embodiment will be denoted with like reference numerals. The names and the functions of these members are also the same. Accordingly, a detailed description of these members will not be given hereinafter.

An SOC calculation device according to the second embodiment of the invention includes, like the first embodiment, the secondary battery 104, the ammeter 108, the voltmeter 110, the memory 112, the interface (hereinafter referred to as "I/F") 114, the battery ECU 116 and the monitor 118.

The ammeter 108 and the voltmeter 110 are connected to the battery ECU 116 via the I/F 114. The memory 112 and the monitor 118 are connected to the battery ECU 116. Furthermore, the memory 112 and monitor 118 are connected to the battery ECU 116.

The memory 112 stores formula 1 (V1=terminal voltage–charge/discharge polarization voltage–internal resistor drop voltage) used in calculation of electromotive voltage V1. In addition, the memory 112 stores a predetermined map for each secondary battery 104, showing the relationship between electromotive voltage V1 and the SOC of the secondary battery 104

The I/F 114 converts analogue signals from the ammeter 108 and the voltmeter 110 into digital signals and then transmits the digital signals to the battery ECU 116.

The battery ECU 116 calculates the current integrated value using charge and discharge currents I to and from the secondary battery 104, detected by the ammeter 108. The battery ECU 116 uses the calculated current integrated value to calculate a first SOC estimate. The battery ECU 116 uses the terminal voltage detected by the voltmeter 110 and the current detected by the ammeter 108 to calculate the charge/discharge polarization voltage and internal resistor drop voltage. The battery ECU 116 calculates electromotive voltage V1 using the terminal voltage, the charge/discharge polarization voltage, the internal resistor drop voltage, and formula 1. Furthermore, the battery ECU 116 determines the second SOC estimate corresponding to electromotive voltage V1 based on the map stored in the memory 112.

The battery ECU 116 calculates the correction amount based on the first SOC estimate and the second SOC estimate. In addition, the second SOC estimate is corrected by adding the aforementioned correction amount, thus calculating the SOC of the secondary battery 104. The battery ECU 116 outputs a signal indicating the calculated SOC.

The monitor 118 displays the SOC of the secondary battery 104 calculated by the battery ECU 116.

Hereinafter, the effects of the second embodiment according to the invention will be described, with reference to FIG. 7.

As shown in FIG. 7, the battery charge and discharge currents I are measured (step S501) and then integrated to determine the current integrated value (step S502). The SOC of the secondary battery is calculated using this current integrated value (step S503). This SOC can be regarded as the first SOC estimate according to the invention.

Furthermore, the charge/discharge polarization voltage is calculated based on the measured value of the charge and discharge currents I. The charge/discharge polarization voltage is equivalent to the range of voltage fluctuation influenced by past charge and discharge history (step S 504). In addition, the drop voltage (the fall in voltage) caused by the internal resistor of the battery is also calculated based on the charge and discharge currents I (step S505).

Next, the terminal voltage is measured (step S506) and the electromotive voltage V1 of the battery is calculated based on this terminal voltage V, the aforementioned charge/discharge polarization voltage and internal resistor drop voltage (step S507). More specifically, the electromotive voltage V1 of the secondary battery is the value obtained by deducting the charge/discharge polarization voltage and the internal resistor drop voltage from the terminal voltage.

The SOC estimate of the secondary battery is calculated based on the relationship of the electromotive voltage V1 calculated in the aforementioned way and the SOC of the secondary battery (step S508). This SOC estimate can be regarded as the second SOC estimate according to the invention.

Next, the correction amount of the SOC of the battery is calculated (step S509) using PI (proportion, integration) control based on the difference between the aforementioned first SOC estimate (step S508) and the first SOC estimate (step S503) determined in advance based on the current integrated value. The first SOC estimate is corrected by adding this correction amount, thus calculating the SOC estimate value.

The parameter for SOC correction used in the aforementioned PI control can be determined using the aforementioned electromotive voltage of the battery (step S510). In order to realize this, a map of the electromotive voltages and correction parameters is prepared in advance, and the correction parameter is determined based on this map. Moreover, as shown in FIG. 1, it is preferable to include a battery temperature factor in this map (step S511). With this configuration, it is possible to determine the correction parameter more accurately.

The aforementioned correction parameter is determined based on the fact that there are SOC levels at which estimates are more and less accurate when determining the SOC correction amount based on the electromotive voltage V1 of the battery. In other words, at SOC levels where less accurate SOC estimates are obtained based on the electromotive voltage V1 of the battery, the correction parameter is determined such that the SOC correction amount based on the electromotive voltage V1 is reduced and thus has less influence. On the other hand, at SOC levels where more accurate SOC estimates are obtained based on the electromotive voltage V1 of the battery, the correction parameter is determined such that the SOC correction amount based on the electromotive voltage V1 is increased and thus has more influence. As a result, regardless of the SOC level, a high degree of accuracy of the SOC estimate of the battery can be maintained. Accordingly, highly accurate SOC estimates can always be maintained without being influenced by the pattern of charge and discharge.

As has been described, according to the invention, the correction parameters are determined such that when the SOC of the battery which is determined based on the current integrated value is corrected by the electromotive voltage of the battery, the correction amount is larger at SOC levels where the SOC estimate based on the electromotive voltage is more accurate, and the correction amount is smaller at SOC levels where the estimate is less accurate. As a result, is it possible to both improve the accuracy of the SOC estimate at all SOC levels, and provide a highly accurate SOC calculation method regardless of the charge and discharge pattern.

In the aforementioned first and second embodiments the SOC of a secondary battery that executes charge and discharge was detected. However, the invention is not limited to this and can also be used with a battery that only executes discharge. Moreover, with regard to the first embodiment, it is also possible to correct the detected SOC using a correction amount based on electromotive force.

It is to be understood that the embodiments disclosed at this time are only examples, and thus do not limit the invention in any regard. Moreover, the scope of the invention is as disclosed in the patent claims, and is not limited by the description of the embodiments above. It is intended that the patent claims include any modification of the invention within the scope of the patent claims, or within a scope equivalent to the spirit of the patent claims.

What is claimed is:

1. A state of charge calculation device that calculates a state of charge of a battery connected to a load, comprising:

a current detection portion that detects discharge current of a battery; and a voltage detection portion that detects a voltage of the battery; and a controller for calculating a first state of charge estimate by integrating the detected discharge current, and correcting the first state of charge estimate using an electromotive voltage correction parameter, that is determined using an electromotive voltage based on the detected voltage, wherein the controller determines a second state of charge estimate based on the electromotive voltage, determines a correction amount based on a difference between the first state of charge estimate and the second state of charge estimate using the electromotive voltage correction parameter, and corrects the second state of charge estimate using the correction amount.

2. The state of charge calculation device according to claim 1, wherein the battery is a secondary battery, and the current detection portion detects a charge and discharge current of the secondary battery.

3. A state of charge calculation method for calculating a state of charge of a battery connected to a load, comprising the steps of:

detecting a discharge current of the secondary battery; and detecting a voltage of the secondary battery; and detecting a time of a start of discharge to the load from the secondary battery; and calculating a first state of charge estimate by integrating the detected discharge current; and correcting the state of charge using an electromotive voltage correction parameter, that is determined using an electromotive voltage based on the detected voltage determining a second state of charge estimate based on the electromotive voltage; and determining a correction amount based on the difference between the first state of charge estimate and the second state of charge estimate using the electromotive voltage correction parameter, wherein the second state of charge estimate is corrected using the correction amount.

4. The state of charge calculation method according to claim 3, wherein the battery is a secondary battery and the step of detecting current detects the charge and discharge currents of the secondary battery.

* * * * *

UNITED STATES PATENT AND TRADEMARK OFFICE
CERTIFICATE OF CORRECTION

PATENT NO. : 6,845,332 B2
DATED : January 18, 2005
INVENTOR(S) : Teruo Ishishita It is certified that error appears in the above-identified patent and that said Letters Patent is hereby corrected as shown below:

<u>Title page,</u>
Item [75], Inventors, change "Ishishita Teruo" to -- Teruo Ishishita --.

Signed and Sealed this

Sixteenth Day of August, 2005

JON W. DUDAS
*Director of the United States Patent and Trademark Office*